United States Patent
Lee et al.

(10) Patent No.: US 7,535,747 B2
(45) Date of Patent: May 19, 2009

(54) PHASE CHANGE RANDOM ACCESS MEMORY AND RELATED METHODS OF OPERATION

(75) Inventors: Kwang-jin Lee, Hwaseong-si (KR);
Woo-yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 51 days.

(21) Appl. No.: 11/844,512

(22) Filed: Aug. 24, 2007

(65) Prior Publication Data
US 2008/0055963 A1 Mar. 6, 2008

(30) Foreign Application Priority Data
Sep. 4, 2006 (KR) ........................ 10-2006-0084863

(51) Int. Cl.
*G11C 11/00* (2006.01)
(52) U.S. Cl. .................. 365/148; 365/113; 365/163
(58) Field of Classification Search ................ 365/113, 365/148, 163, 189.011, 158
See application file for complete search history.

(56) References Cited

U.S. PATENT DOCUMENTS

| | | | |
|---|---|---|---|
| 5,822,244 A | 10/1998 | Hansen et al. | |
| 7,088,621 B2* | 8/2006 | Guterman et al. | 365/185.18 |
| 2008/0056023 A1* | 3/2008 | Lee et al. | 365/189.011 |
| 2008/0235443 A1* | 9/2008 | Chow et al. | 711/103 |

FOREIGN PATENT DOCUMENTS

| | | |
|---|---|---|
| JP | 2000040383 | 2/2000 |
| JP | 2002319281 | 10/2002 |
| JP | 2004095029 | 3/2004 |
| KR | 1020020047772 A | 6/2002 |
| KR | 1020050056114 A | 6/2005 |

* cited by examiner

*Primary Examiner*—Gene N. Auduong
(74) *Attorney, Agent, or Firm*—Volentine & Whitt, PLLC

(57) ABSTRACT

In a phase change random access memory (PRAM) device, data is programmed in selected memory cells using a plurality of program loops. In each program loop, division program operations for cell groups including the selected memory cells are performed in consecutive timeslots.

24 Claims, 11 Drawing Sheets

PHASE CHANGE RANDOM ACCESS MEMORY AND RELATED METHODS OF OPERATION

CROSS REFERENCE TO RELATED APPLICATIONS

This application claims the priority of Korean Patent Application No. 10-2006-0084863 filed on Sep. 4, 2006, the disclosure of which is hereby incorporated by reference in its entirety.

BACKGROUND OF THE INVENTION

1. Field of the Invention

Embodiments of the invention relate generally to phase change random access memory (PRAM) devices and related methods of operation. More particularly, embodiments of the invention relate to PRAM devices and related methods of performing program operations including divisional program operations and verify read operations.

2. Description of Related Art

Phase change memory devices store data using phase change materials, such as chalcogenide, which are capable of stably transitioning between amorphous and crystalline phases. The amorphous and crystalline phases (or states) exhibit different resistance values used to distinguish different logic states of memory cells in the memory devices. In particular, the amorphous phase exhibits a relatively high resistance and the crystalline phase exhibits a relatively low resistance.

At least one type of phase change memory device—PRAM—uses the amorphous state to represent a logical '1' and the crystalline state to represent a logical '0'. In a PRAM device, the crystalline state is referred to as a "set state" and the amorphous state is referred to as a "reset state". Accordingly, a memory cell in a PRAM stores a logical '0' by setting a phase change material in the memory cell to the crystalline state, and the memory cell stores a logical '1' by setting the phase change material to the amorphous state. Various PRAM devices are disclosed, for example, in U.S. Pat. Nos. 6,487,113 and 6,480,438.

The phase change material in a PRAM is converted to the amorphous state by heating the material to a first temperature above a predetermined melting temperature and then quickly cooling the material. The phase change material is converted to the crystalline state by heating the material at a second temperature lower than the melting temperature but above a crystallizing temperature for a sustained period of time. Accordingly, data is programmed to memory cells in a PRAM by converting the phase change material in memory cells of the PRAM between the amorphous and crystalline states using heating and cooling as described above.

The phase change material in a PRAM typically comprises a compound including germanium (Ge), antimony (Sb), and tellurium (Te), i.e., a "GST" compound. The GST compound is well suited for a PRAM because it can quickly transition between the amorphous and crystalline states by heating and cooling. In addition to, or as an alternative for the GST compound, a variety of other compounds can be used in the phase change material. Examples of the other compounds include, but are not limited to, 2-element compounds such as GaSb, InSb, InSe, $Sb_2Te_3$, and GeTe, 3-element compounds such as GeSbTe, GaSeTe, InSbTe, $SnSb_2Te_4$, and InSbGe, or 4-element compounds such as AginSbTe, (GeSn)SbTe, GeSb(SeTe), and $Te_{81}Ge_{15}Sb_2S_2$.

The memory cells in a PRAM are called "phase change memory cells". A phase change memory cell typically comprises a top electrode, a phase change material layer, a bottom electrode contact, a bottom electrode, and an access transistor. A read operation is performed on the phase change memory cell by measuring the resistance of the phase change material layer, and a program operation is performed on the phase change memory cell by heating and cooling the phase change material layer as described above.

Unfortunately, conventional PRAM devices can receive several bits of input at the same time but are unable to simultaneously program the bits into corresponding memory cells. For example, a PRAM may receive 16 inputs through a plurality of pins, but the PRAM may not be able to simultaneously access 16 phase change memory cells. One reason for this shortcoming is that if a current of 1 mA is required to program one phase change memory cell, then a current of 16 mA would be required to simultaneously program 16 phase change memory cells. Moreover, if the efficiency of a driver circuit providing the current is 10%, then in reality, a current of 160 mA would be required to simultaneously program the 16 memory cells. However, conventional PRAM devices are generally not equipped to provide currents with such high magnitudes.

Since a program driver in a PRAM device can only provide a limited amount of current, a program operation of several phase change memory cells can be divided into several "divisional program operations" each requiring only a fraction of the total current required to program all of the several phase change memory cells. In each divisional program operation, a subset (i.e., a "division") of memory cells among a larger group are programmed. For example, a group of sixteen phase change memory cells can be programmed by dividing the sixteen phase change memory cells into eight groups (i.e., divisions) of two and simultaneously programming the two memory cells in each group of two in eight successive divisional program operations.

To prevent unnecessary current consumption and programming failures, the PRAM device may also perform a verify read operation to verify the program status of each selected memory cell. To perform the verify read operation, program data to be programmed in the selected memory cells is stored in a temporary storage location such as a program buffer. Next, the program data is programmed into selected cells. Then, the data stored in the selected memory cells is read and compared with the program data stored in the temporary storage location. Where the data stored in the temporary storage location is different from the data stored in the selected memory cells, the verify read operation indicates a program failure. Otherwise, the verify read operation indicates a program success.

FIG. 1 is a conceptual timing chart illustrating a conventional method of operating a PRAM device that uses divisional program operations. For explanation purposes, it will be assumed that a program operation of the PRAM device programs 16 bits of data to 16 selected memory cells divided into eight pairs, or groups, using eight divisional program operations.

Referring to FIG. 1, data is programmed in the PRAM device using a plurality of program loops (L=1 through "k"). Before each program loop begins, a verify read operation is performed to detect memory cells, among the selected memory cells, that have not been successfully programmed. Thereafter, a divisional program operation is performed on groups of memory cells where at least one memory cell has not been successfully programmed—referred to as "failed groups" (incidentally, individual memory cells that have not been successfully programmed will be referred to as "failed cells"). In the example of FIG. 1, eight divisional program operations 1̂ through 8̂ correspond to eight respective cell groups.

In a program operation, all eight groups of memory cells generally begin as failed groups. Accordingly, in the first program loop (L=1), a divisional program operation is typically executed for each of the eight groups. In the second program loop (L=2), assuming that the third and fourth groups have been successfully programmed, a divisional program operation is performed on all eight groups, except for the third and fourth groups. Similarly, in remaining program loops, fewer groups are programmed as more groups become successfully programmed.

Unfortunately, conventional methods such as that illustrated in FIG. 1 may be unnecessarily slow due to time gaps where no programming is performed, such as the time gap between the second and fifth divisional program operations of the second program loop (L=2).

SUMMARY OF THE INVENTION

Selected embodiments of the invention provide PRAM devices and related program methods adapted to improve the efficiency and reliability of the devices.

According to one embodiment of the invention, a method of performing a program operation in a phase change random access memory (PRAM) device comprising a plurality of phase change memory cells divided into a plurality of cell groups is provided. The method comprises reading verification data from selected memory cells among the plurality of phase change memory cells, comparing the verification data with program data to be programmed in the selected memory cells and identifying "n" ("n" is a natural number greater than 2) failed memory cells among the selected memory cells based on the comparison, and programming the "n" failed memory cells with a subset of the program data using "m" ("m" is a natural number greater than 2) divisional program operations corresponding to "m" failed cell groups, wherein each of the "m" failed cell groups includes at least one of the "n" failed memory cells. The "m" divisional program operations are performed in "m" consecutive and substantially evenly spaced timeslots of a current program loop.

According to another embodiment of the invention, another method of performing a program operation in a PRAM device comprising a plurality of phase change memory cells divided into a plurality of cell groups is provided. The method comprises (a) performing one or more sequential checking operations on respective cell groups among the plurality of cell groups until a failed group is detected, wherein the respective cell groups include a plurality of selected memory cells; (b) upon detecting the failed group, performing a divisional program operation to program data to the detected failed group; and (c) repeating (a) and (b) until a checking operation has been performed on all of the plurality of cell groups.

According to still another embodiment of the invention, another method of performing a program operation in a phase change random access memory (PRAM) device comprising a plurality of phase change memory cells divided into a plurality of cell groups is provided. The method comprises setting a divisional program mode of the device to determine the number of phase change memory cells included in each of the cell groups, and setting a verify read mode of the device to place the device in a first verify read mode wherein verification data is compared with program data to be programmed in selected memory cells prior to each program loop of a program operation, or in a second verify read mode wherein verification data is compared to program data to be programmed in selected memory cells using one or more sequential checking operations performed during each program loop of the program operation.

According to yet another embodiment of the invention, a phase change random access memory device is provided. The device comprises a plurality of phase change memory cells divided into a plurality of cell groups, and a programming circuit adapted to perform a program operation on selected memory cells among the plurality of cell groups. The programming circuit reads verification data from the selected memory cells, compares the verification data with program data to be programmed in the selected memory cells, identifies "n" ("n" is a natural number greater than 2) failed memory cells among the selected memory cells based on the comparison, and programs the "n" failed memory cells with a subset of the program data using "m" ("m" is a natural number greater than 2) divisional program operations corresponding to "m" failed cell groups, wherein each of the "m" failed cell groups includes at least one of the "n" failed memory cells. The "m" divisional program operations are performed in "m" consecutive and substantially evenly spaced timeslots of a current program loop.

According to still another embodiment of the invention, another phase change random access memory device is provided. The device comprises a plurality of phase change memory cells divided into a plurality of cell groups, and a programming circuit performing a first verify read operation on selected memory cells among the plurality of memory cells. The first verify read operation comprises (a) performing one or more sequential checking operations on respective cell groups among the plurality of cell groups until a failed group is detected, wherein the respective cell groups include the selected memory cells; (b) upon detecting the failed group, performing a divisional program operation to program data to the detected failed group; and (c) repeating (a) and (b) until a checking operation has been performed on all of the plurality of cell groups.

According to still another embodiment of the invention, another phase change random access memory device is provided. The device comprises a plurality of phase change memory cells divided into a plurality of cell groups, a first mode selecting unit designating a divisional program mode to determine a number of phase change memory cells included in each cell group, and a second mode selecting unit designating a first verify read mode wherein verification data is compared with program data to be programmed in selected memory cells prior to each program loop of a program operation, or a second verify read mode wherein verification data is compared to program data to be programmed in selected memory cells using one or more sequential checking operations performed during each program loop of the program operation.

BRIEF DESCRIPTION OF THE DRAWINGS

Embodiments of the invention are described below in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 2:
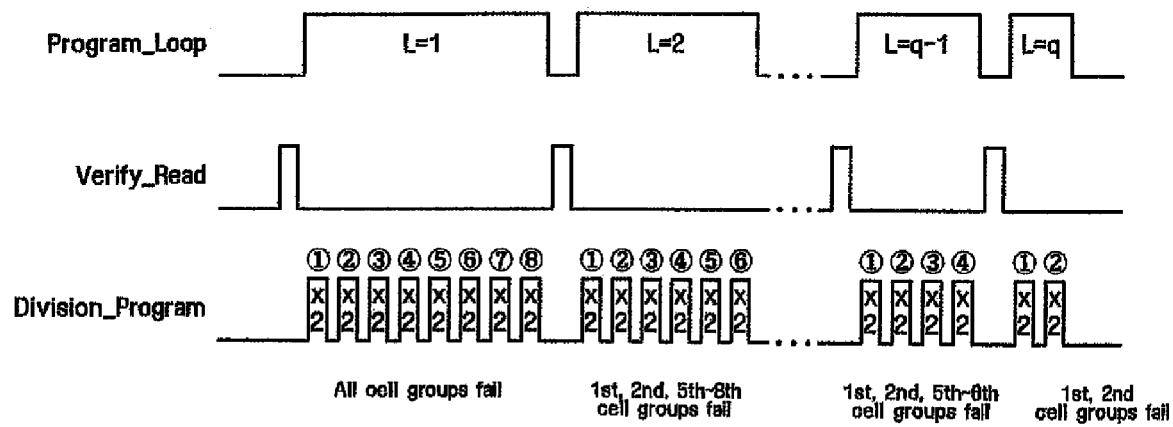
FIG. 2 is a conceptual timing chart illustrating a method of performing a program operation in a PRAM device according to an embodiment of the invention.

FIG. 2 is a conceptual timing chart illustrating a method of performing a program operation in a PRAM device according to an embodiment of the invention.

Referring to FIG. 2, data is programmed to the PRAM device using a plurality of program loops. Before each program loop, a verify read operation is performed to determine whether selected memory cells have been successfully programmed. In this written description, data to be programmed in selected memory cells will be referred to as program data, and data read from the selected memory cells in a verify read operation will be referred to as verification data.

In each program loop, program data is programmed to selected cells using a plurality of divisional program operations corresponding to cell groups including the selected memory cells. However, in each program loop, divisional program operations are only performed on cell groups including selected memory cells that have not been successfully programmed, i.e., "failed groups".

For explanation purposes, it will be assumed that sixteen bits of data are simultaneously input to the PRAM device via sixteen input/output (IO) pins. The sixteen bits are then programmed into sixteen selected phase change memory cells in eight groups of two cells each, as illustrated, e.g., in Table 1 below. In the example of Table 1, a first group consists of memory cells corresponding to zero-th and eighth IO pins IO0 and IO8, a second group consists of memory cells corresponding to first and ninth IO pins IO1 and IO9, and so on. Data is simultaneously programmed into the two memory cells of each group, while memory cells in different groups are programmed at different times.

TABLE 1

| | IO pins | | | | | | | |
|---|---|---|---|---|---|---|---|---|
| | {0, 8} | {1, 9} | {2, 10} | {3, 11} | {4, 12} | {5, 13} | {6, 14} | {7, 15} |
| Cell group | 1 | 2 | 3 | 4 | 5 | 6 | 7 | 8 |

Figure 1:
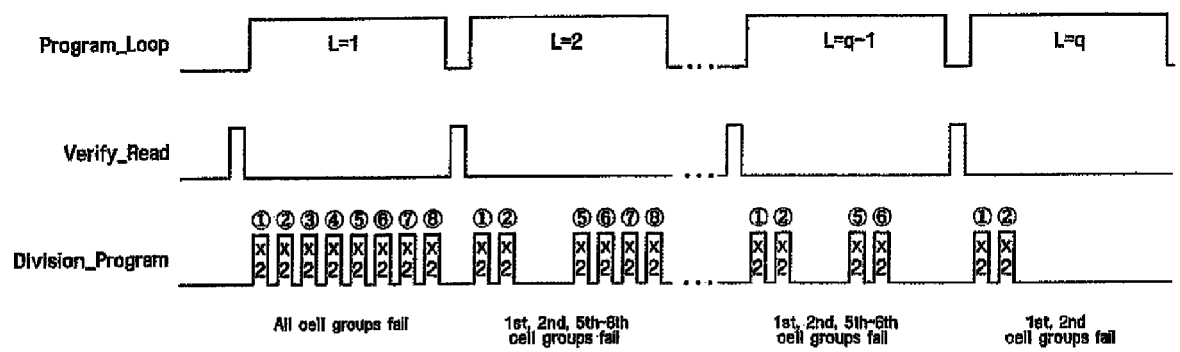
FIG. 1 is a conceptual timing chart illustrating a conventional method of performing a program operation in a PRAM device.

In the method illustrated in FIG. 2, first through eighth cell groups are initially failed groups. Accordingly, the first through eighth cell groups are programmed in first through eighth divisional program operations during a first program loop. Then, in a verify read operation following the first program loop, first, second, and fifth through eighth cell groups are detected to be failed groups. Accordingly, divisional program operations are performed on the detected failed groups in a second program loop. However, unlike the method of FIG. 1, in the method of FIG. 2, the divisional program operations in the second program loop of FIG. 2 are performed consecutively so that there is a reduced time gap between the divisional program operations corresponding to the second and fifth cell groups.

By reducing the time gap between the divisional program operations corresponding to the second and fifth cell groups, the duration of the second program loop in the method of FIG. 2 is reduced. As a result, the time required to perform the program operation is also reduced. Similarly, using the method of FIG. 2, the duration of subsequent program loops (e.g., program loops L=q−1 and L=q) is reduced in accordance with the number of divisional program operations to be performed, thus reducing the duration of the program operation even further.

Because the method of FIG. 2 adjusts the duration of each program loop in accordance with the number of divisional program operations to be performed in the loop, the program operation of FIG. 2 may be referred to as an "adaptive program operation".

In broad conceptual terms, the method of performing a program operation illustrated in FIG. 2 can be explained as follows. In the method, "n" (n is a natural number) failed phase change memory cells are included in "m" (m is a natural number) cell groups. Data is programmed in the "n" failed phase change memory cells during "m" sequential divisional program operations regardless of the total number of cell groups including selected memory cells or the organization of the failed cell groups.

Figure 3A:
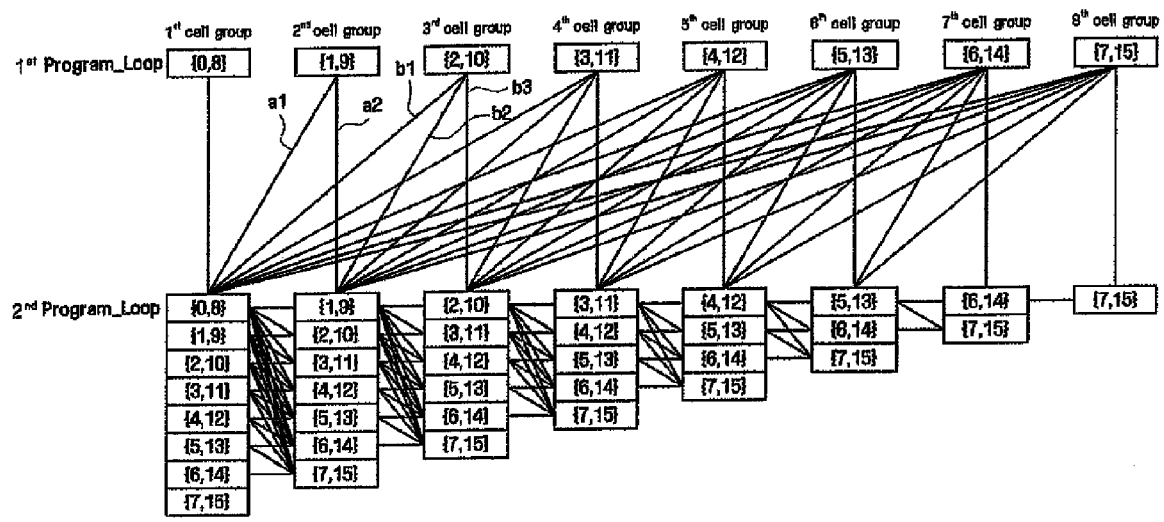
FIG. 3A is a conceptual diagram illustrating a technique for adjusting the timing of execution for divisional program operations according to an embodiment of the invention.
Figure 3B:
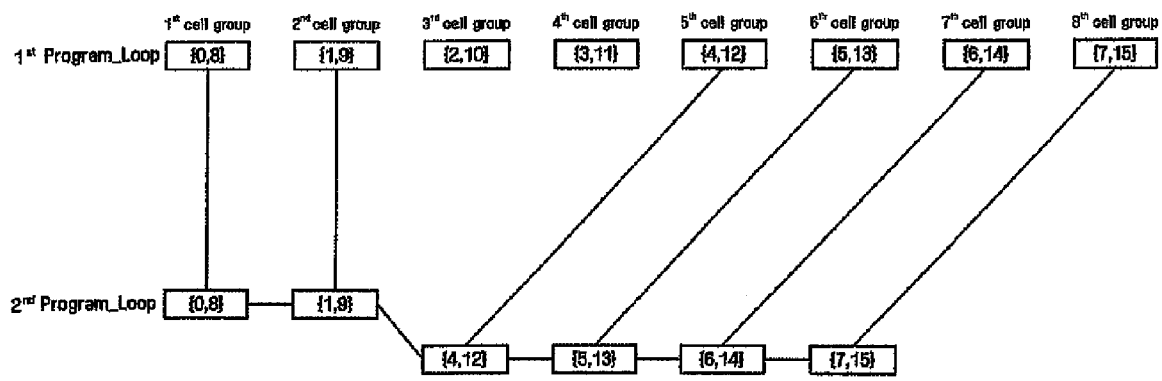
FIG. 3B is a conceptual diagram illustrating a timing adjustment of divisional program operations in the second program loop of FIG. 2.
Figure 4A:
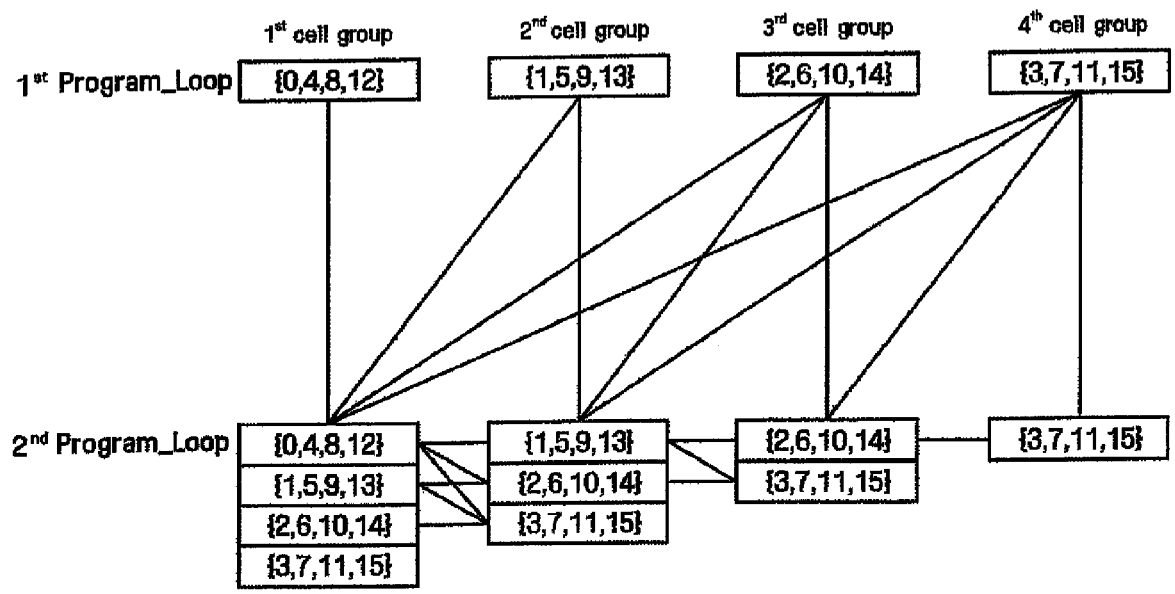
FIGS. 4A and 4B are conceptual diagrams illustrating a technique for adjusting the timing of execution for divisional program operations according to another embodiment of the invention.
Figure 4B:
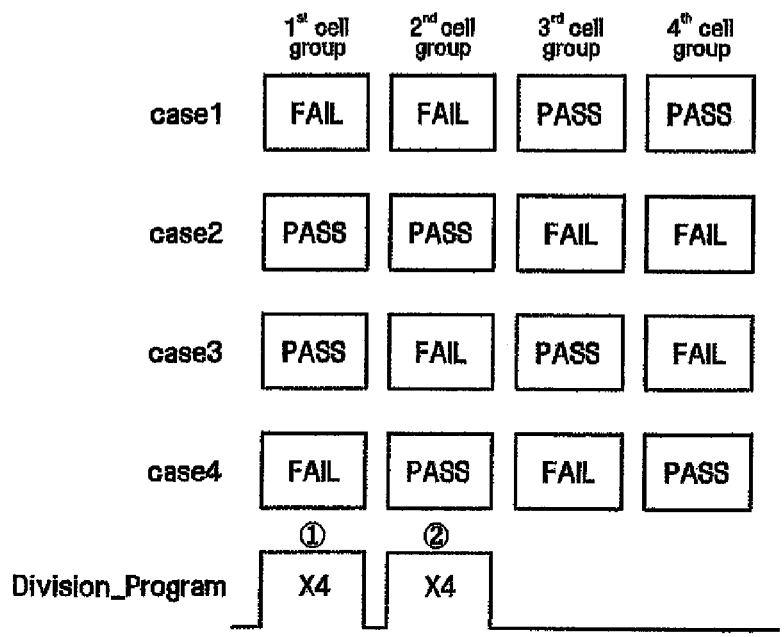
Figure 5:
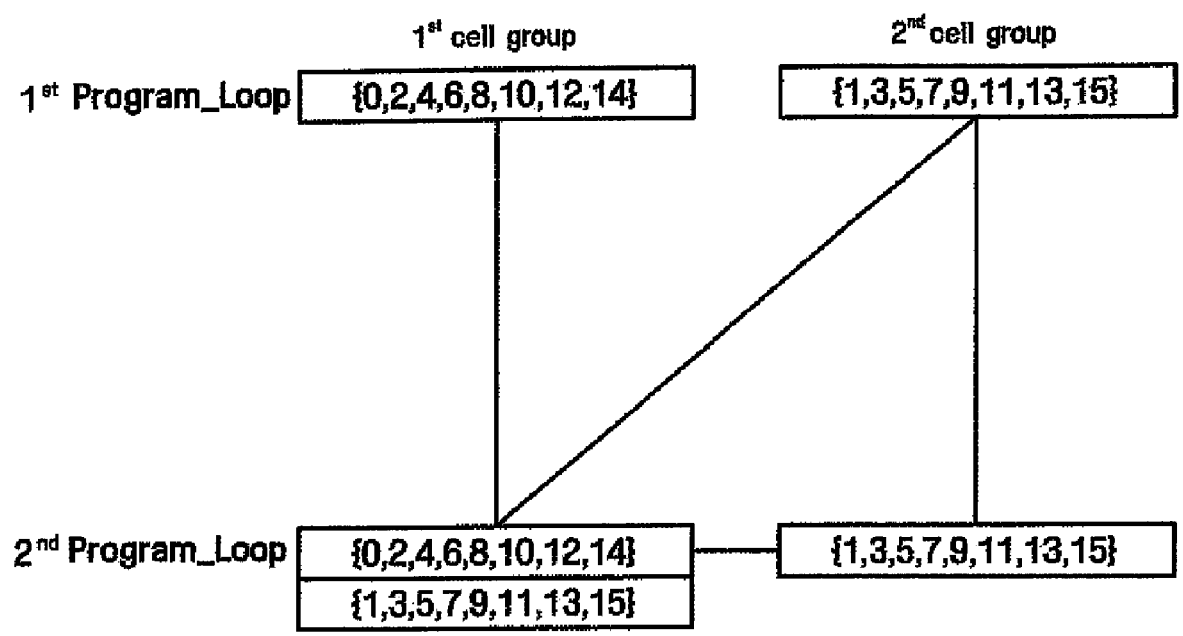
FIG. 5 is a conceptual diagram illustrating a technique for adjusting the timing of execution for divisional program operations according to yet another embodiment of the invention.

FIGS. 3 through 5 are conceptual diagrams illustrating various techniques that can be used to implement an adaptive program operation such as that illustrated in FIG. 2. For explanation purposes, it will be assumed that the techniques of FIGS. 3 through 5 cause divisional program operations to be performed in different "time slots". For instance, in a technique illustrated in FIGS. 3A and 3B, first through eighth cell groups are programmed during respective first through eighth time slots during a first program loop. Then, in a second program loop, the fifth through eighth cell groups are "shifted" such that they are programmed during the third through sixth time slots, respectively.

In FIGS. 3A and 3B, each box represents a cell group corresponding to selected memory cells represented by numbers in brackets. Solid lines represent potential time shifts between successive program loops; however, whether time shifts actually occur depends on whether cell groups are successfully programmed during each program loop. For instance, in the example of FIGS. 3A and 3B, the third and fourth cell groups are successfully programmed during the first program loop while the remaining cell groups are not. Accordingly, the timing of the fifth through eighth cell groups is shifted for the second program loop.

FIGS. 4A and 5 are similar to FIG. 3A, except that in FIGS. 4A and 5, it is assumed that each cell group includes a larger number of memory cells. For example, in FIG. 4A, it is assumed that each cell group contains four memory cells to be simultaneously programmed and in FIG. 5, it is assumed that each cell group contains eight memory cells to be simultaneously programmed.

FIG. 4B shows examples of different events that can occur in a particular program loop of a PRAM using groups of four memory cells as in FIG. 4A. Referring to FIG. 4B, in an event labeled "CASE1", the first and second cell groups are not successfully programmed in a first program loop but the third and fourth cell groups are successfully programmed. Accordingly, a second program loop performs divisional program operations on the first and second cell groups, but not on the third and fourth cell groups, as illustrated at the bottom of FIG. 4B. Although the diagram of FIG. 4B does not show an exhaustive set of all possible events, a few other possible events are illustrated as examples, albeit without accompanying waveform diagrams.

Figure 6:
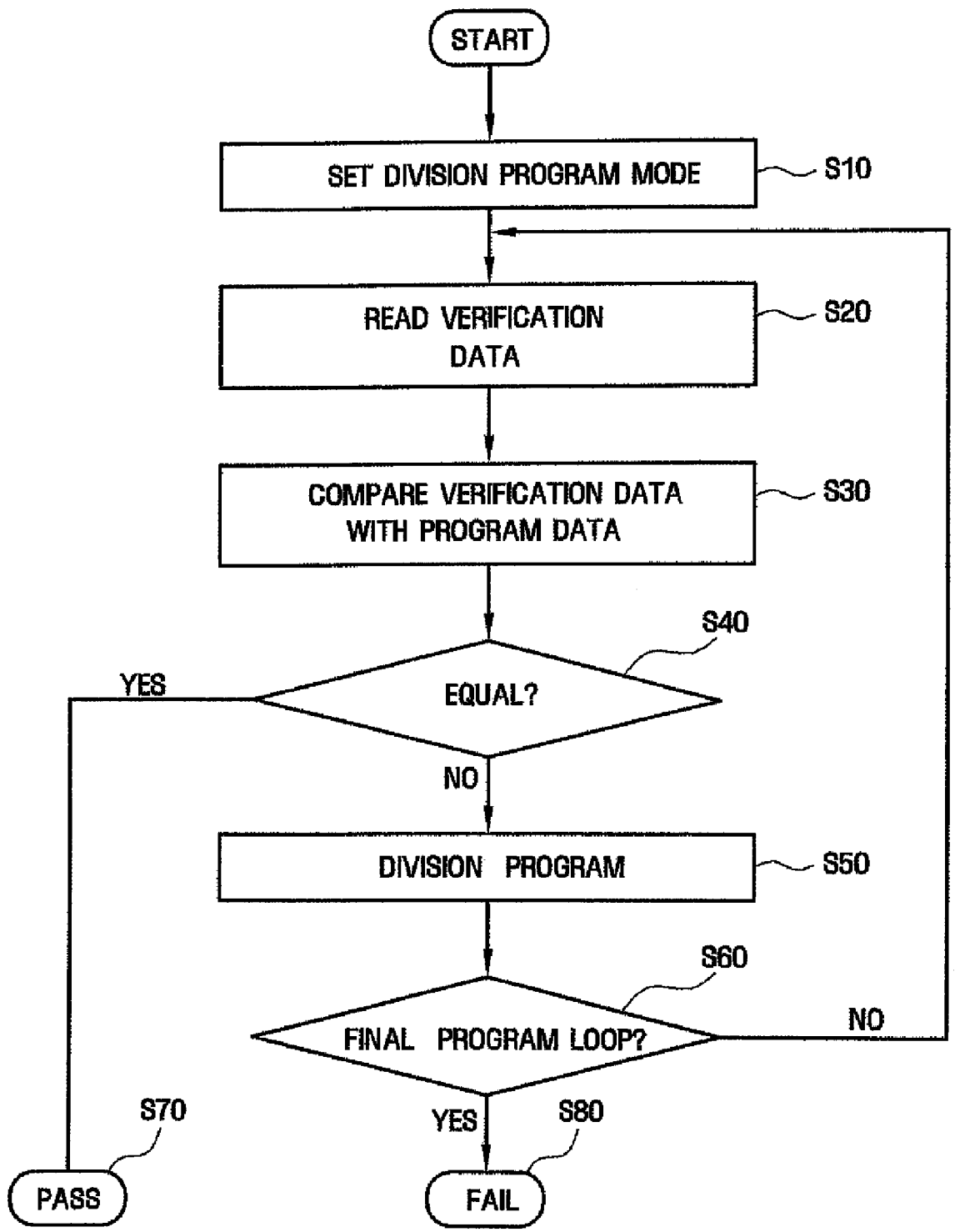
FIG. 6 is a flowchart illustrating a method of performing a program operation in a PRAM device according to an embodiment of the invention.

FIG. 6 is a flowchart illustrating a method of performing a program operation in a PRAM device according to an embodiment of the invention. For explanation purposes, it will be assumed that the method of FIG. 6 implements the timing chart of FIG. 2.

Referring to FIG. 6, a divisional program mode is set (S10). The divisional program mode determines a number of memory cells to be simultaneously programmed. For example, a set of sixteen selected memory cells could be divided into eight groups of two memory cells (×2 divisional program mode), four groups of four memory cells (×4 divisional program mode), two groups of eight memory cells (×8 divisional program mode), or one group of sixteen memory cells (×16 divisional program mode).

Thereafter, verification data is read from selected phase change memory cells (S20). Then, the verification data is compared with program data to be programmed in the selected memory cells (S30). Next, a decision is made based on the comparison (S40). If the verification data is equal to the program data (S40=YES), the program operation terminates with a pass status (S70). Otherwise (S40=NO), divisional program operations are performed on failed cell groups based on the comparison performed in s30 (S50).

After s50, the method determines whether a final program loop has been completed (S60). If the final program loop has been completed (S60=YES), the method terminates with a "fail" status (S80). Otherwise, the method returns to s20 repeats s20 and subsequent steps.

Figure 7:
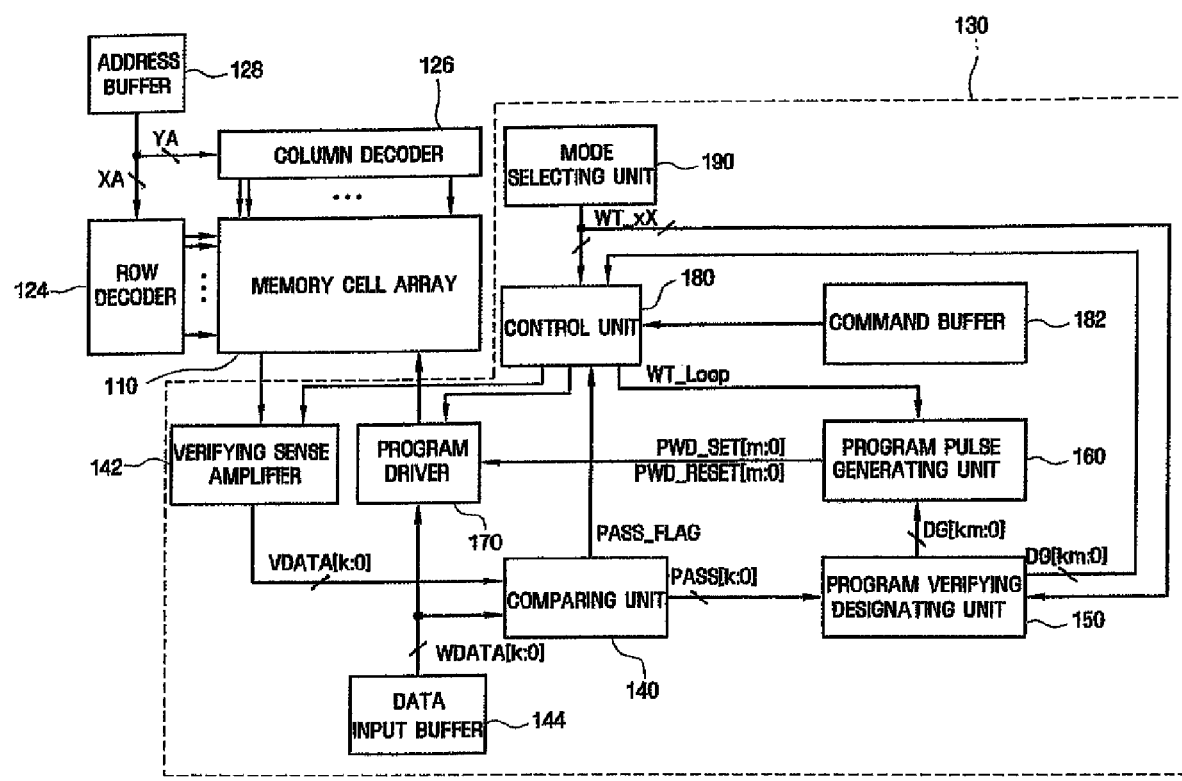
FIG. 7 is a block diagram illustrating a PRAM device according to an embodiment of the invention.

FIG. 7 is a block diagram illustrating a PRAM device according to an embodiment of the invention. For explanation purposes, it will be assumed that the PRAM device of FIG. 7 is designed to implement the method of FIG. 2 or the flowchart of FIG. 6.

Referring to FIG. 7, the PRAM device comprises a memory cell array 110, a row decoder 124, a column decoder 126, an address buffer 128, and a programming circuit 130.

Memory cell array 110 comprises a plurality of phase change memory cells that can be divided into a plurality of cell groups. Although not shown in the drawings, each phase change memory cell comprises a phase change resistance material and an access element such as a transistor or a diode. The access element is used to control the supply of current to the phase change resistance material during program, read, and erase operations.

Row decoder 124 is provided with a row address XA output by address buffer 128, decodes row address XA, and selects a row of the plurality of phase change memory cells to be programmed based on decoded row address XA. Column decoder 126 is provided with a column address YA output by address buffer 128, decodes column address YA, and selects columns of the plurality of phase change memory cells to be programmed based on the decoded column address YA.

Programming circuit 130 performs an adaptive verify read operation on the plurality of selected phase change memory cells. Specifically, programming circuit 130 compares verification data VDATA read out from the selected phase change memory cells with program data WDATA to be programmed to the selected phase change memory cells and identifies a plurality of "failed" phase change memory cells whose verification data VDATA and program data WDATA are different from each other based on the comparison. Thereafter, programming circuit 130 programs data in the failed phase change memory cells where data having a first logic state (e.g., data "1") is to be programmed, and then programs data in failed phase change memory cells where data having the second logic state (for example, data "0") is to be programmed.

Programming circuit 130 comprises a comparing unit 140, a verifying sense amplifier 142, a data input buffer 144, a program verifying designating unit 150, a program pulse generating unit 160, a program driver 170, a control unit 180, a command buffer 182, and a mode selecting unit 190.

Comparing unit 140 compares verification data VDATA read from the selected phase change memory cells by verifying sense amplifier 142 with program data WDATA output by data input buffer 144, and outputs comparison signals PASS. Comparison signals PASS indicate "n" different failed phase change memory cells among "k" selected phase change memory cells whose verification data VDATA and program data WDATA are different from each other. Comparing unit 140 supplies a flag signal PASS_FLAG to control unit 180. Where verification data VDATA and program data WDATA are equal to each other, flag signal PASS_FLAG assumes a first logic state (e.g., logic level "high"), and where verification data VDATA and program data WDATA are different from each other, flag signal PASS_FLAG assumes a second logic state (e.g., logic level "low").

Program verifying designating unit 150 receives comparison signals PASS and generates designating signals DG designating "m" divisional program operations used to program data in each of the "n" failed phase change memory cells.

Program pulse generating unit 160 receives designating signals DG and a program loop signal WT_LOOP and generates set pulse control signals PWD_SET and reset pulse control signals PWD_RESET during divisional program operations in program loops.

Program driver 170 receives program data WDATA, set pulse control signals PWD_SET, and reset pulse control signals PWD_RESET, and generates a set pulse or a reset pulse corresponding to the program data to failed phase change memory cells.

Control unit 180 receives a program command from command buffer 182 and controls verifying sense amplifier 142, program driver 170, and program pulse providing unit 160 to perform an adaptive program verifying operation. Control unit 180 receives designating signals DG and adjusts the operation of verifying sense amplifier 142, and receives flag signal PASS_FLAG with the first logic state and stops the adaptive program verifying operation. Furthermore, control unit 180 receives a mode selecting signal WT_xX selecting a divisional program mode from mode selecting unit 190, and controls the operation of verifying sense amplifier 142 in accordance with the selected divisional program mode.

Figure 8:
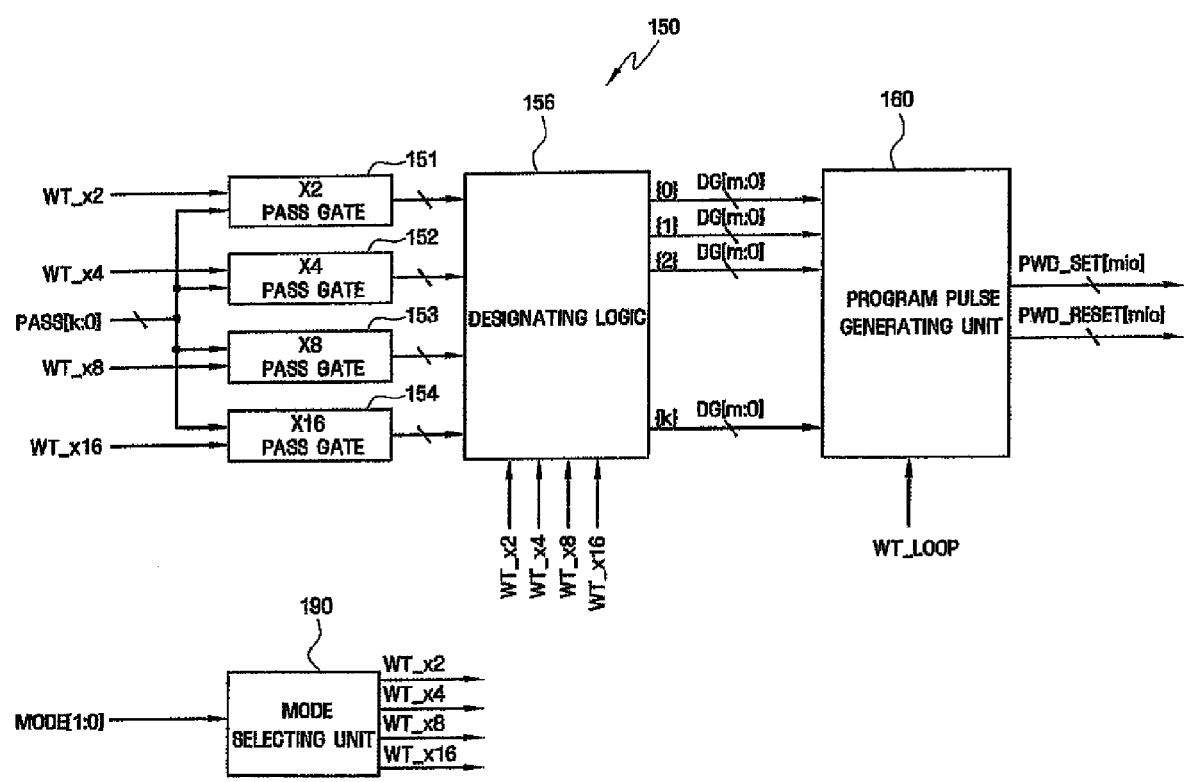
FIG. 8 is a block diagram illustrating an embodiment of a program verifying designating unit in the PRAM device of FIG. 7.
Figure 9:
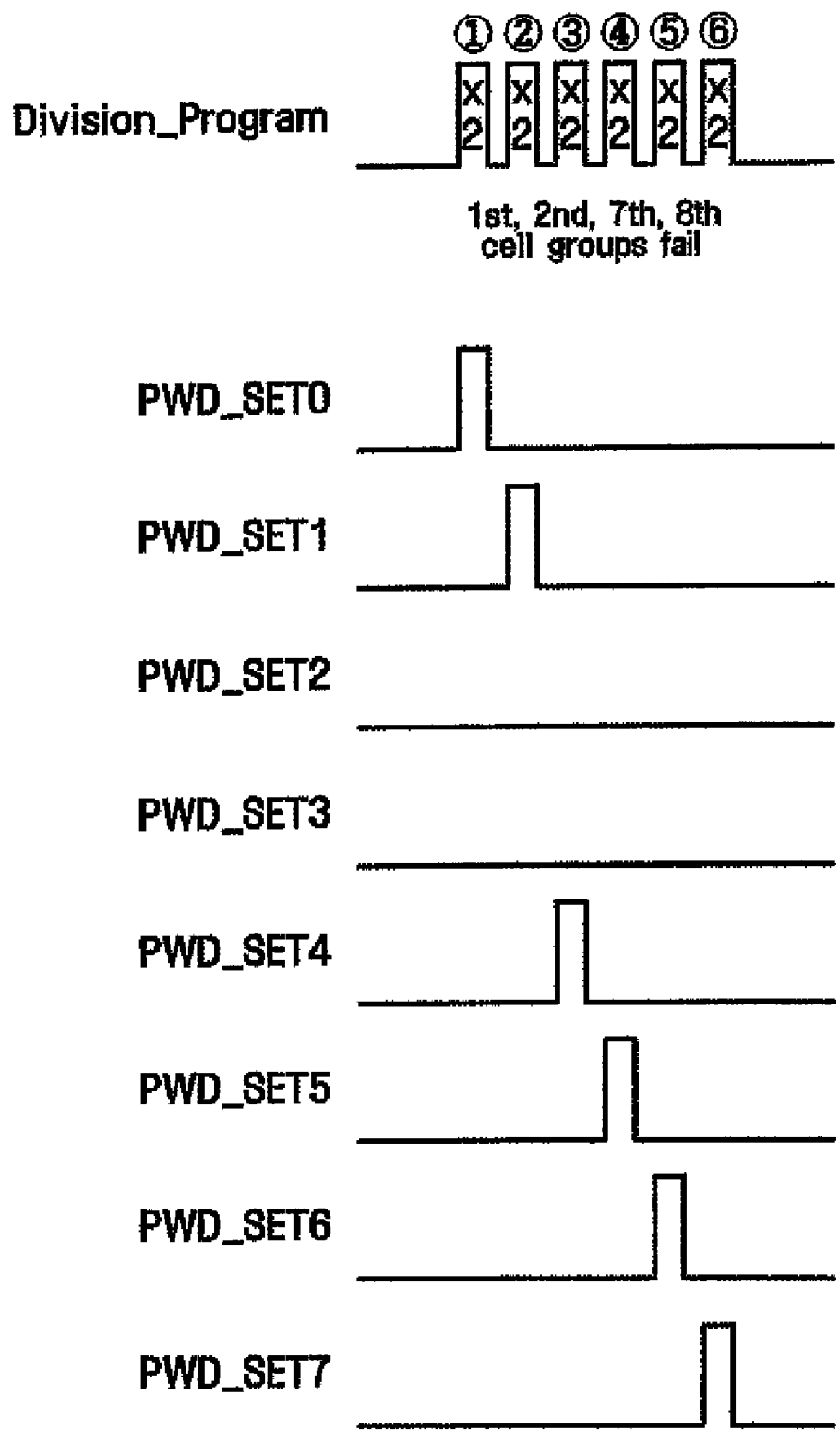
FIG. 9 is a conceptual timing chart illustrating an example of a set pulse control signal output by a program pulse generating unit in the PRAM device of FIG. 7.

FIG. 8 is a detailed block diagram illustrating an embodiment of program verifying designating unit 150 shown in FIG. 7. To provide context, mode selecting unit 190 and program pulse generating unit 160 are also shown in FIG. 8. FIG. 9 is a timing chart illustrating an example of a set pulse control signal output by program pulse generating unit 160.

Referring to FIG. 8, mode selecting unit 190 receives a mode control signal MODE and generates a plurality of mode selecting signals WT_x2, WT_x4, WT_x8, and WT_x6 for selecting divisional program modes. A mode selecting signal (for example, WT x2) corresponding to a selected divisional program mode assumes a first logic state (for example, high level "high"), and the remaining mode selecting signals WT_x4, WT_x8, and WT_x16 assume a second logic state (e.g., logic level "low").

Program verifying designating unit 150 comprises a plurality of pass gates 151, 152, 153, and 154, and a designating logic unit 156.

The plurality of pass gates 151, 152, 153, and 154 correspond to a plurality of mode selecting signals, respectively. The plurality of pass gates 151, 152, 153, and 154 are supplied with the plurality of mode selecting signals WT_x2, WT_x4, WT_x8, and WT_x16, respectively, and selectively transmit comparison signals PASS. Pass gate 151 supplied with mode selecting signal WT_x2 having the first logic state becomes enabled and transmits comparison signals PASS; pass gates 152, 153, and 154 respectively supplied with mode selecting signals WT_x4, WT_x8, and WT_x16 of the second level become disabled.

Designating logic unit 156 receives comparison signals PASS and mode selecting signals WT_x2, WT_x4, WT_x8, and WT_x16 and generates designating signals DG designating the "m" divisional program sessions such that a program order of the "m" fail cell groups is checked and data is programmed according to a desired program order. Example methods for determining the program order are described above with reference to FIGS. 3A through 5.

Program pulse generating unit 160 receives designating signals DG and program loop signal WT_LOOP and outputs set pulse control signals PWD_SET and reset pulse control signals PWD_RESET. For convenience of description, FIG. 9 shows set pulse control signals PWD_SET generated when first, second, and fifth through eighth cell groups fail in the second program loop illustrated in the timing chart shown in FIG. 2.

Referring to FIG. 9, the first through eighth set pulse control signals PWD_SET0 through PWD_SET7 correspond to the respective first through eighth cell groups in the method of FIG. 2. Since the third and fourth cell groups have been successfully programmed (i.e., "passed"), third and fourth set pulse control signals PWD_SET2 and PWD_SET3 are maintained at a low level. However, remaining set pulse control signals PWD_SET0, PWD_SET1, and PWD_SET4 to PWD_SET7 are sequentially generated without overlapping each other.

Figure 10:
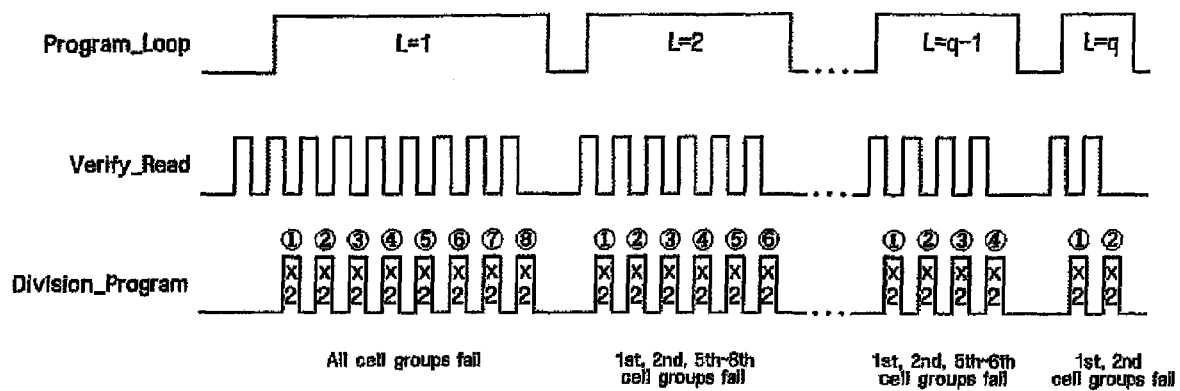
FIG. 10 is a conceptual timing chart illustrating a method of performing a program operation in a PRAM device according to another embodiment of the invention.
Figure 11:
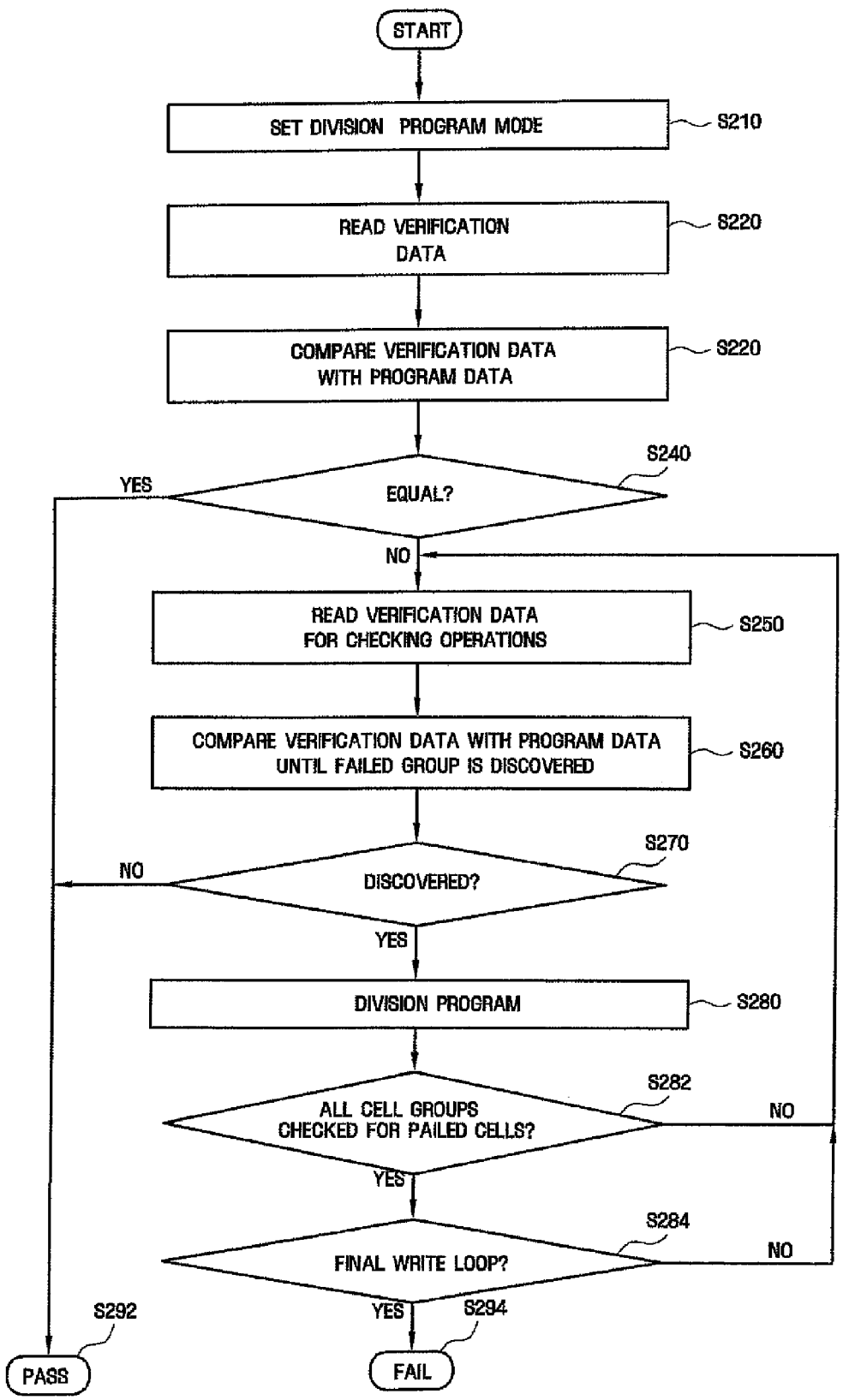
FIG. 11 is a flowchart illustrating a method of performing a program operation in a PRAM device according to another embodiment of the invention.

FIG. 10 is a conceptual timing chart illustrating a method of performing a program operation in a PRAM device according to another embodiment of the invention. FIG. 11 is a flowchart illustrating the method FIG. 10. Because the method illustrated in FIGS. 10 and 11 bears some similarity to the methods illustrated in FIGS. 2 and 6, the description of some aspects of these methods may be abbreviated to avoid redundancy.

One way in which the method illustrated in FIGS. 10 and 11 differs from the method of FIGS. 6 and 7 is that the method of FIGS. 10 and 11 performs a verify read operation on selected cell groups before each divisional program operation in each program loop.

Referring to FIG. 11, the method begins by setting a divisional program mode (S210). The divisional program mode determines a number of memory cells to be simultaneously programmed. For example, a set of sixteen selected memory cells could be divided into eight groups of two memory cells (×2 divisional program mode), four groups of four memory cells (×4 divisional program mode), two groups of eight memory cells (×8 divisional program mode), or one group of sixteen memory cells (×16 divisional program mode).

Thereafter, verification data is read from selected phase change memory cells (S220). The verification data is then compared with program data to be programmed in the selected memory cells (S230). Based on the comparison, the method branches (S240). Where the verification data is equal to the program data (S240=YES), the method terminates with a "pass" status (S292). Otherwise (S240=NO), a program loop is executed.

In the program loop, the verification data is read from the selected memory cells (S250). Next, one or more sequential "checking operations" is performed to detect a failed group (if any exists) among the cell groups to be programmed (S260). In each "checking operation", the verification data corresponding to a cell group is compared with program data corresponding to the cell group. If the verification data for the cell group is different from the program data for the cell group, the method has "discovered" (S270=YES) a failed cell group, and a divisional program operation is performed on the failed cell group (S280). However, where no failed group is detected (S270=NO), the method terminates with a "pass" status (S292).

After a divisional program operation is performed on a detected failed group in step S280, the method determines whether all cell groups have been checked for failed cells (S282). Where not all cell groups have been checked for failed cells during the program loop (S282=NO), the method returns to step S250. Otherwise (S282=YES), the program loop is completed and therefore the method determines whether the program loop was a final program loop (S284). If so, the method terminates with a "fail" status (S294). If not (S284=NO), the method returns to step S250 and another program loop is performed.

In general, the method illustrated in FIGS. 10 and 11 performs the steps of checking for failed groups in sequence. For example, after a divisional program operation has been performed on the first cell group in the second program loop of FIG. 10, the method next checks whether the second cell group is a failed group. The method stores the cell groups that have already been checked for failed cells to avoid performing redundant checking during a single program loop. This storage can be accomplished, for example, by a simple counter keeping track of how many cell groups have been checked in the program loop. After each program loop, the counter can be reset.

In the method of FIGS. 10 and 11, since a verify read operation is performed before each divisional program operation, the process illustrated in FIGS. 3A through 5 for determining programming order does not need to be performed. As a result, the method of FIGS. 10 and 11 may be simplified in comparison with the method of FIGS. 2 and 6. As a result, the method of FIGS. 10 and 11 can be implemented using a PRAM device having a design similar as that illustrated in FIG. 7, but where program verifying designating unit 150 is replaced by a counter.

Figure 12:
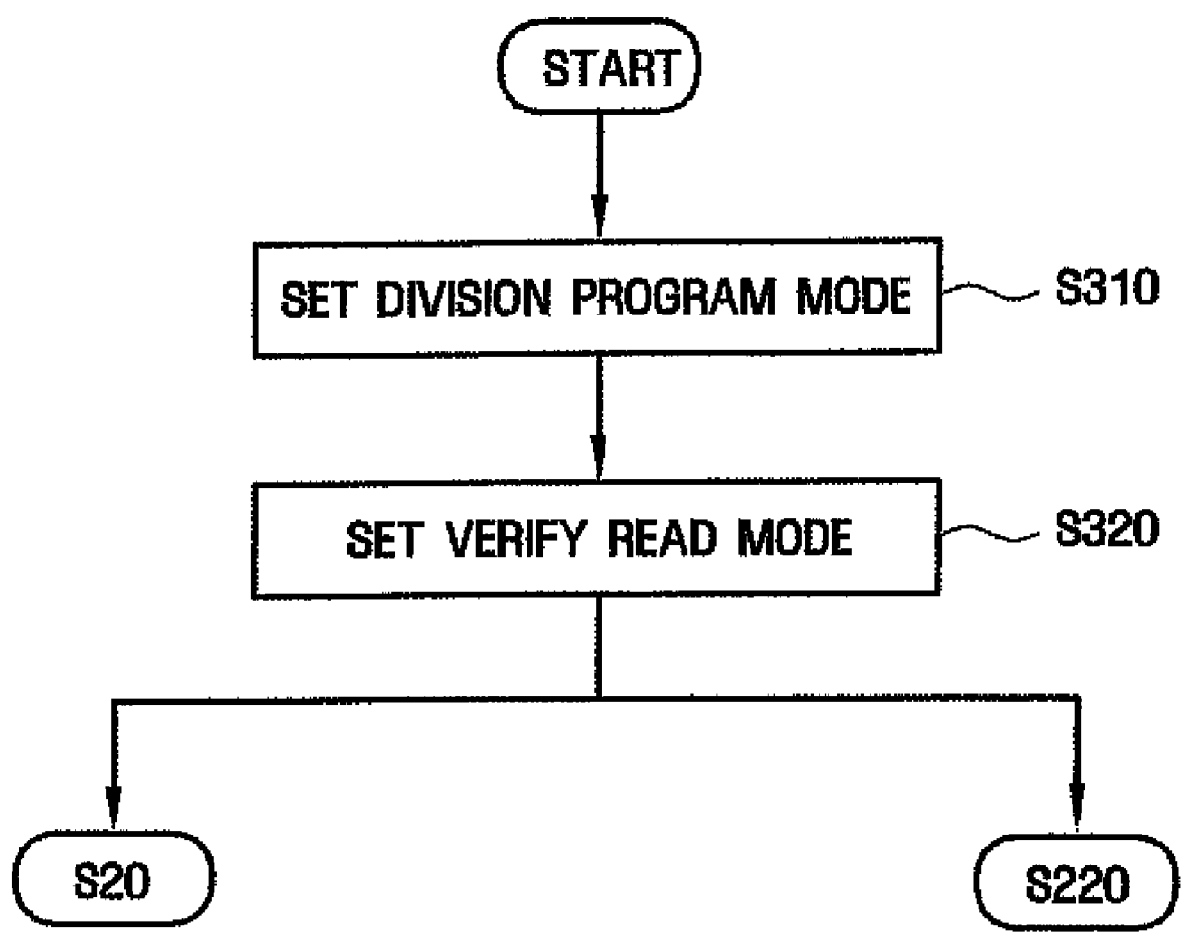
FIG. 12 is a flowchart illustrating a method of performing a program operation in a PRAM device according to still another embodiment of the invention.

FIG. 12 is a flowchart illustrating a method of performing a program operation in a PRAM device according to a yet another embodiment of the invention. In the method of FIG. 12, a verify read mode is set to determine whether several verify read operations are performed in the course of each program loop as in FIGS. 10 and 11, or whether a single verify read operation is performed before each program loop, as illustrated in FIGS. 2 and 6.

In the method of FIG. 12, a divisional program mode is set (S310). Then, the verify read mode is set (S320). If the verify read mode is set to a first mode, a program operation is performed using the method of FIG. 6, beginning with step S20. Otherwise, if the verify read mode is set to a second mode, the program operation is performed using the method of FIG. 11, beginning with step S220.

The method of FIG. 12 can be implemented in a PRAM device having a design similar to that illustrated in FIG. 7, but modified to include, for example, an additional mode selecting unit for selecting the verify read mode.

As described above, embodiments of the invention provide more efficient program operations compared with conventional program methods by eliminating unnecessary time gaps between successive divisional program operations.

The foregoing exemplary embodiments are teaching examples. Those of ordinary skill in the art will understand that various changes in form and details may be made to the exemplary embodiments without departing from the scope of the invention as defined by the following claims.

What is claimed:

1. A method of performing a program operation in a phase change random access memory (PRAM) device comprising a plurality of phase change memory cells divided into a plurality of cell groups, the method comprising:
   reading verification data from selected memory cells among the plurality of phase change memory cells;
   comparing the verification data with program data to be programmed in the selected memory cells and identifying "n" ("n" is a natural number greater than 2) failed memory cells among the selected memory cells based on the comparison; and
   programming the "n" failed memory cells with a subset of the program data using "m" ("m" is a natural number greater than 2) divisional program operations corresponding to "m" failed cell groups, wherein each of the "m" failed cell groups includes at least one of the "n" failed memory cells;
   wherein the "m" divisional program operations are performed in "m" consecutive and substantially evenly spaced timeslots of a current program loop.

2. The method of claim 1, wherein the at least one of the "m" divisional program operations is time-shifted in the current program loop relative to its position in a previous program loop such that the duration of the current program loop is shorter than the duration of the previous program loop.

3. The method of claim 1, wherein the at least one of the "m" divisional program operations is time-shifted in the current program loop by determining timeslot assignments for each of the "m" divisional program operations prior to beginning the current program loop and time-shifting the at least one of the "m" divisional program operations in accordance with the timeslot assignments.

4. The method of claim 1, further comprising:
   subsequent to the current program loop, determining that the verification data is equal to the program data; and
   upon determining that the verification data is equal to the program data, terminating the program operation.

5. The method of claim 1, further comprising:
   setting a divisional program mode to determine the number of phase change memory cells included in each cell group.

6. A method of performing a program operation in a phase change random access memory (PRAM) device comprising a plurality of phase change memory cells divided into a plurality of cell groups, the method comprising:
   (a) performing one or more sequential checking operations on respective cell groups among the plurality of cell groups until a failed group is detected, wherein the respective cell groups include a plurality of selected memory cells;
   (b) upon detecting the failed group, performing a divisional program operation to program data to the detected failed group; and
   (c) repeating (a) and (b) until a checking operation has been performed on all of the plurality of cell groups.

7. The method of claim 6, further comprising:
   reading verification data from the selected memory cells;
   comparing the verification data to program data to be programmed in the selected memory cells and detecting failed cells among the selected memory cells based on the comparison; and
   upon detecting at least one failed cell, performing (a), (b), and (c).

8. The method of claim 6, further comprising:
   setting a divisional program mode to determine the number of phase change memory cells included in each cell group.

9. A method of performing a program operation in a phase change random access memory (PRAM) device comprising a plurality of phase change memory cells divided into a plurality of cell groups, the method comprising:
   setting a divisional program mode of the device to determine the number of phase change memory cells included in each of the cell groups; and
   setting a verify read mode of the device to place the device in a first verify read mode wherein verification data is compared with program data to be programmed in selected memory cells prior to each program loop of a program operation, or in a second verify read mode wherein verification data is compared to program data to be programmed in selected memory cells using one or more sequential checking operations performed during each program loop of the program operation.

10. The method of claim 9, further comprising, in the first verify read mode,
   reading verification data from the selected memory cells;

comparing the verification data with the program data and identifying "n" ("n" is a natural number greater than 2) failed memory cells among the selected memory cells based on the comparison; and programming the "n" failed memory cells with a subset of the program data using "m" ("m" is a natural number greater than 2) divisional program operations corresponding to "m" failed cell groups, wherein each of the "m" failed cell groups includes at least one of the "n" failed memory cells;

wherein the "m" divisional program operations are performed in "m" consecutive and substantially evenly spaced timeslots of a current program loop.

11. The method of claim 9, further comprising, in the second verify read mode:
(a) performing one or more sequential checking operations on respective cell groups among the plurality of cell groups until a failed group is detected, wherein the respective cell groups include the selected memory cells;
(b) upon detecting the failed group, performing a divisional program operation to program data to the detected failed group; and
(c) repeating (a) and (b) until a checking operation has been performed on all of the plurality of cell groups.

12. A phase change random access memory device, comprising:
a plurality of phase change memory cells divided into a plurality of cell groups; and
a programming circuit adapted to perform a program operation on selected memory cells among the plurality of cell groups;
wherein the programming circuit reads verification data from the selected memory cells, compares the verification data with program data to be programmed in the selected memory cells, identifies "n" ("n" is a natural number greater than 2) failed memory cells among the selected memory cells based on the comparison, and programs the "n" failed memory cells with a subset of the program data using "m" ("m" is a natural number greater than 2) divisional program operations corresponding to "m" failed cell groups, wherein each of the "m" failed cell groups includes at least one of the "n" failed memory cells;
wherein the "m" divisional program operations are performed in "m" consecutive and substantially evenly spaced timeslots of a current program loop.

13. The method of claim 12, wherein the at least one of the "m" divisional program operations is time-shifted in the current program loop relative to its position in a previous program loop such that the duration of the current program loop is shorter than the duration of the previous program loop.

14. The device of claim 12, wherein the programming circuit comprises:
a comparing unit comparing the verification data with the program data and outputting comparison signals indicating the "n" failed memory cells;
a program verifying designating unit receiving the comparison signals and supplying designating signals for designating the "m" divisional program operations;
a program pulse generating unit receiving the designating signals and generating a set pulse control signal and a reset pulse control signal according to the timing of the designated divisional program operations; and
a program driver receiving the program data, the set pulse control signal, and the reset pulse control signal, and generating a set pulse or a reset pulse corresponding to the program data to the failed memory cells.

15. The device of claim 14, wherein the program verifying designating unit comprises:
a designating logic unit receiving the comparison signals, determining a program order of the "m" fail cell groups, and generating designating signals for designating "m" divisional program operations, such that the program data is programmed to the failed memory cells according to the program order.

16. The device of claim 14, wherein the program verifying designating unit comprises:
a first resistor storing the comparison signals in synchronization with a first reference clock;
a designating logic unit receiving the comparison signals, determining a program order of the "m" fail cell groups, and generating designating signals for designating "m" divisional program operations, such that the program data is programmed to the failed memory cells according to the program order; and
a second register receiving and storing the designating signals and outputting the designating signals in synchronization with a second reference clock.

17. The device of claim 14, wherein the program verifying circuit further comprises:
a mode selecting unit receiving a mode control signal and generating a plurality of mode selecting signals selecting divisional program modes; and
wherein the program verifying designating unit comprises:
a plurality of pass gates receiving the respective mode selecting signals and selectively transmitting the comparison signal based on respective logic states of the mode selecting signals; and
a designating logic unit receiving the comparison signals, determining a program order of the "m" fail cell groups, and generating designating signals for designating "m" divisional program operations, such that the program data is programmed to the failed memory cells according to the program order.

18. The device of claim 12, wherein the phase change random access memory device has a plurality of divisional program modes, and
the number of phase change memory cells included in each cell group differs according to the plurality of divisional program modes.

19. A phase change random access memory device comprising:
a plurality of phase change memory cells divided into a plurality of cell groups; and
a programming circuit performing a first verify read operation on selected memory cells among the plurality of memory cells, the first verify read operation comprising:
(a) performing one or more sequential checking operations on respective cell groups among the plurality of cell groups until a failed group is detected, wherein the respective cell groups include the selected memory cells;
(b) upon detecting the failed group, performing a divisional program operation to program data to the detected failed group; and
(c) repeating (a) and (b) until a checking operation has been performed on all of the plurality of cell groups.

20. The phase change random access memory device of claim 19, wherein the programming circuit performs a second verifying read operation, the second verify read operation comprising:
reading verification data from the selected memory cells;

comparing the verification data to program data to be programmed in the selected memory cells and detecting failed cells among the selected memory cells based on the comparison; and upon detecting at least one failed cell, performing (a), (b), and (c).

21. The phase change random access memory device of claim 19, wherein the programming circuit comprises:

a comparing unit comparing a plurality of verification data read from the selected memory cells with program data to be programmed to the selected memory cells and outputting comparison signals indicating results of the comparison;

a program verifying designating unit receiving the comparison signals, performing the one or more checking operations, and generating a designating signal designating the divisional program operation to be performed on the failed cell group;

a program pulse generating unit receiving the designating signal and supplying a set pulse control signal and a reset pulse control signal according to the timing of the designated divisional program operation; and a program driver receiving the program data, the set pulse control signal, and the reset pulse control signal, and supplying a set pulse or a reset pulse to program the failed cell group.

22. The phase change random access memory device of claim 21, wherein the program verifying designating unit comprises:

a counter indicating cell groups on which a checking operation has been performed.

23. The device of claim 19, wherein the phase change random access memory device has a plurality of divisional program modes, and the number of phase change memory cells included in each cell group differs according to the plurality of divisional program modes.

24. A phase change random access memory device comprising:

a plurality of phase change memory cells divided into a plurality of cell groups;

a first mode selecting unit designating a divisional program mode to determine a number of phase change memory cells included in each cell group; and a second mode selecting unit designating a first verify read mode wherein verification data is compared with program data to be programmed in selected memory cells prior to each program loop of a program operation, or a second verify read mode wherein verification data is compared to program data to be programmed in selected memory cells using one or more sequential checking operations performed during each program loop of the program operation.

* * * * *